(12) United States Patent
Lee et al.

(10) Patent No.: US 6,540,839 B1
(45) Date of Patent: Apr. 1, 2003

(54) APPARATUS AND METHOD TO PASSIVATE MAGNETS AND MAGNETIC MATERIALS

(75) Inventors: Walter Lee, N. Plymouth, MN (US); Roger Lee Hipwell, Jr., Eden Prairie, MN (US); Wayne Allen Bonin, North Oak, MN (US); Barry Dean Wissman, Eden Prairie, MI (US); Zine-Eddine Boutaghou, Vadnais Heights, MN (US); Peter Crane, Richfield, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 09/820,550

(22) Filed: Mar. 29, 2001

Related U.S. Application Data

(60) Provisional application No. 60/193,720, filed on Mar. 31, 2000.

(51) Int. Cl.$^7$ ................................................ C23C 16/00
(52) U.S. Cl. ................ 118/724; 118/715; 118/723 E; 118/50.1
(58) Field of Search ........................... 118/724, 715, 118/723 R, 723 E, 50.1; 156/345.33, 345.5, 345.1

(56) References Cited

U.S. PATENT DOCUMENTS

| | | | | |
|---|---|---|---|---|
| 5,803,974 A | * | 9/1998 | Mikoshiba et al. | ... 118/723 MP |
| 6,004,396 A | * | 12/1999 | Ishikawa | ..................... 118/715 |
| 6,053,123 A | * | 4/2000 | Xia | ......................... 118/723 R |

* cited by examiner

*Primary Examiner*—Thi Dang
(74) *Attorney, Agent, or Firm*—Moser, Patterson & Sheridan LLP

(57) ABSTRACT

An apparatus and method is provided for uniformly coating a magnet having a plurality of surfaces and includes a reaction chamber having a port for introducing the magnet into the reaction chamber. A heater is also included for heating the reaction chamber. Also, a carrier gas port is in fluid communications with the reaction chamber for introducing a carrier gas into the reaction chamber. In addition, a reactant gas port is in fluid communications with the reaction chamber for introducing a reactant gas into the reaction chamber. When the magnet and the carrier gas are introduced into the reaction chamber, the magnet becomes suspended in the reaction chamber. Also, when the reactant gas is introduced into the reaction chamber, the reactant gas causes all of the plurality of surfaces of the magnet to be uniformly coated.

12 Claims, 3 Drawing Sheets

APPARATUS AND METHOD TO PASSIVATE MAGNETS AND MAGNETIC MATERIALS

CROSS REFERENCE TO RELATED APPLICATIONS

This application claims the benefit of provisional application entitled "Apparatus and Methods to Passivate Magnets and Magnetic Materials," filed Mar. 31, 2000, bearing the Ser. No. 60/193,720, the contents of which are relied upon and incorporated by reference.

BACKGROUND

The following invention relates to a method and apparatus for passivating magnets and magnetic materials and, in particular, to a method and apparatus for passivating magnets and magnetic materials for use in microelectromechanical systems (MEMS).

Often elements found in microstructures, such as in MEMS devices, require a protective coating. In particular, a magnet used in MEMS device, for example a microactuator, requires an anti-corrosion coating to prevent the degradation of its magnetic properties due to oxidation of the magnetic material and the collection of debris. The need for a protective coating applies to magnets made from a variety of materials including iron, cobalt, Permadur and stainless steel.

Prior art techniques exists for coating magnets to prevent corrosion and degradation. One prior art technique is electroplating, typically using nickel to form a protective coating on the magnet. The prior art electroplating techniques, however, are unsuitable for small magnets used in MEMS devices. First, it is difficult to achieve a conformal coating on such magnets using electroplating especially if the magnets are irregularly shaped. Also, electroplating cannot easily penetrate the pores and holes in the surface of the magnet to achieve a durable coating. As a result, coatings formed using electroplating often have surface bubbles that may later flake off and cause a malfunction in the MEMS device. In addition, the electroplating process causes hydrogen ions or radicals to form in the magnet surface that affect the grain boundary sights of the magnets. Finally, electroplating is generally limited to a few plating materials such as nickel.

Another prior art process for coating magnets is sputtering in which a coating is deposited directly on the surface of the magnet. Sputter deposition, however, is unsuitable for small magnets used in MEMS applications because it requires line of sight processing so that only two sides of the magnet can be coated at a time. Consequently, several processing steps are required to completely coat the magnet which results in a lengthy process and a non-conformal coating.

Another prior art technique for coating magnets is chemical vapor deposition (CVD). The CVD process has the advantage over the other prior art methods of producing a conformal coating. Nevertheless, because the CVD process requires high temperatures that can adversely affect the magnetic properties of magnetic materials, the CVD process is not suitable for MEMS-based magnets.

Accordingly, it is desirable to provide a system and method for providing a conformal protective coating for small magnets and magnetic materials that is suitable for MEMS devices.

SUMMARY OF THE INVENTION

The present invention is directed to overcoming the drawbacks of the prior art. Under the present invention an apparatus and method is provided for uniformly coating a magnet having a plurality of surfaces and includes a reaction chamber having a port for introducing the magnet into the reaction chamber. A heater is also included for heating the reaction chamber. Also, a carrier gas port is in fluid communications with the reaction chamber for introducing a carrier gas into the reaction chamber. In addition, a reactant gas port is in fluid communications with the reaction chamber for introducing a reactant gas into the reaction chamber. When the magnet and the carrier gas are introduced into the reaction chamber, the magnet becomes suspended in the reaction chamber. Also, when the reactant gas is introduced into the reaction chamber, the reactant gas causes all of the plurality of surfaces of the magnet to be uniformly coated.

In an exemplary embodiment, an RF source adjacent the reaction chamber is included so that when the reactant gas is introduced into the reaction chamber, the RF source causes plasma initiated chemical reaction to occur.

In another exemplary embodiment, a UV light source adjacent said reaction chamber is included so that when the reactant gas is introduced in the reaction chamber, the UV light source causes an optically activated chemical reaction to occur.

Accordingly, an apparatus and method is provided for applying a conformal protective coating on small magnets and magnetic materials. In particular, the apparatus and method of the present invention may be used to protectively coat magnets that are used MEMS devices such as disc drive microactuators.

The invention accordingly comprises the features of construction, combination of elements and arrangement of parts that will be exemplified in the following detailed disclosure, and the scope of the invention will be indicated in the claims. Other features and advantages of the invention will be apparent from the description, the drawings and the claims.

DESCRIPTION OF THE DRAWINGS

For a filler understanding of the invention, reference is made to the following description taken in conjunction with the accompanying drawings, in which.

DETAILED DESCRIPTION OF THE PREFERRED EMBODIMENTS

Figure 1:
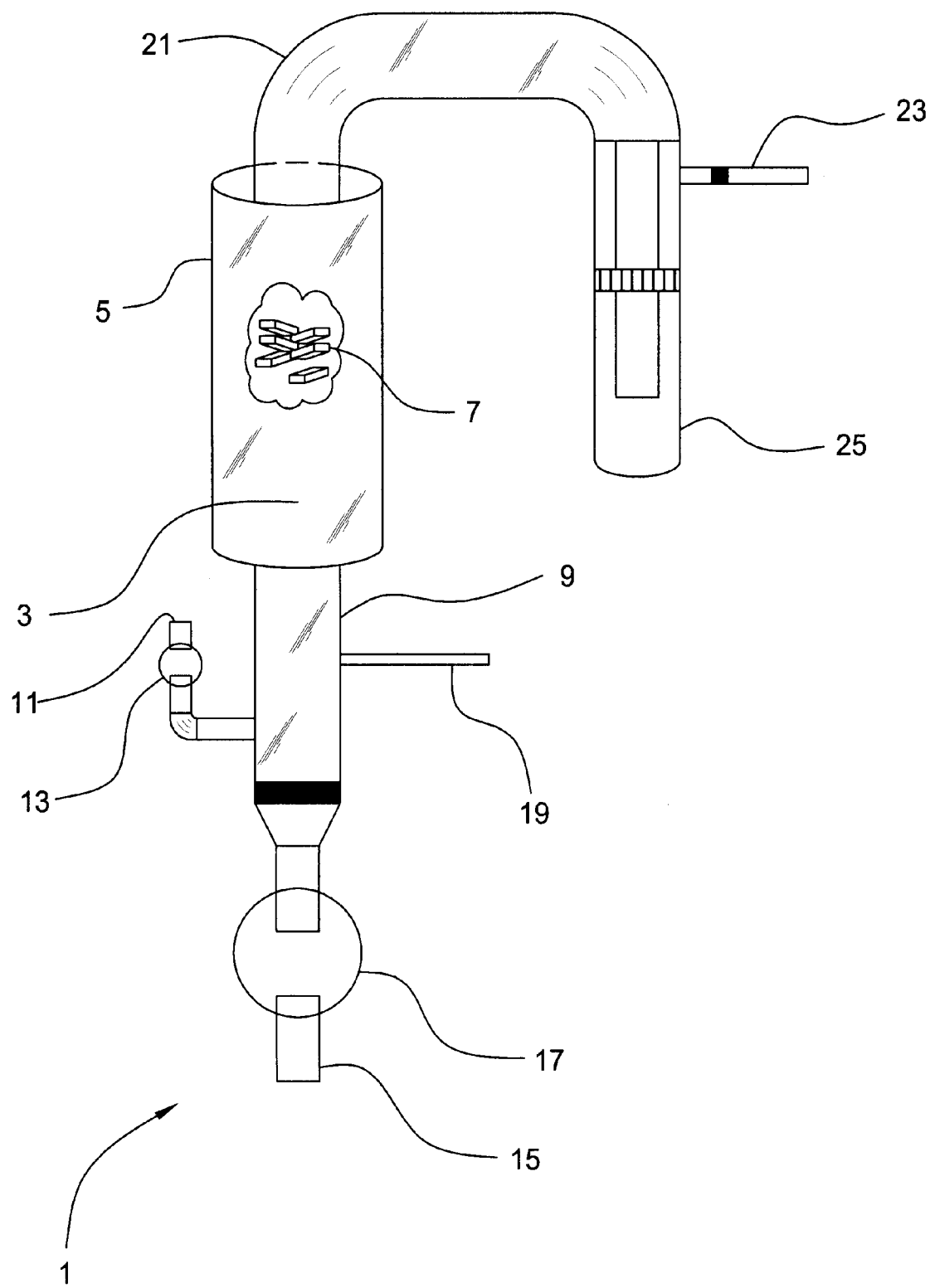
FIG. 1 is schematic of an apparatus for conformally coating magnets according to the present invention.

Referring now to FIG. 1, there is shown an apparatus 1 of the present invention used for applying a conformal protective coating to a plurality of small magnets 7 such as, for example, magnets used in a microactuator. Apparatus 1 includes a reaction chamber 3 that is surrounded by a heater element 5 that regulates the temperature of reaction chamber 3 for promoting a chemical reaction therein. An input tube 9 is coupled to a first end of reaction chamber 3 and includes a magnet port 11 for receiving magnets 7 that are to be coated. Magnet port 11 includes a valve 13 for regulating the introduction of magnets 7 into reaction chamber 3.

Input tube 9 also includes a carrier gas port 15 for introducing a carrier gas into reaction chamber 3. The amount of carrier gas input into reaction chamber 3 is regulated by carrier gas port valve 17 in a manner so that magnets 7 are suspended in reaction chamber 3. In an exemplary embodiment, the carrier gas input into reaction chamber 3 is nitrogen although any inert, non-reactive gas, such as helium, argon and neon, may be used.

Input tube 9 also includes a reactant gas port 19 for introducing the reactant gas into reaction chamber 3 for the purpose of forming a conformal protective coating on the surfaces of magnets 7. In an exemplary embodiment, the reactant gas is a metallo-organic gas because such gases produce a conformal protective coating on magnets 7 at lower operative temperatures than the prior art processes.

The particular metal to be deposited on magnets 7 is bound (chemically or electrostatically) to an organic precursor molecule which may be in a solid, liquid or gaseous form. Gaseous precursors are introduced directly into reaction chamber 3 by standard flow methods. Solid precursors, however, must be heated to increase its vapor pressure before being introduced into the chamber via reactant gas port 19. Similarly, liquid precursors are heated to increase its vapor pressure before being introduced into reactant gas port 19. Table 1 lists gases, liquids and solids, together with their corresponding reactant and disposition temperatures, that may be used in accordance with different embodiments of the present invention.

TABLE 1

| Material | Source Reactant | State | Reactant Temp., C. | Deposition Temp., C. |
|---|---|---|---|---|
| W | $WF_6$ | Gas | — | >400 |
| Mo | $MoF_6$ | Gas | — | >400 |
|  | $Mo(CO)_6$ |  |  |  |
| $SiO_2$/ $Si_3N_4$ | Diethylsilane (DES) | Liquid | 60–70 C. | 350–450 |
| Cu | (hfac)CuTMVS | Liquid | 60 | 100–420 |
| Al | Dimethylaluminum Hydride (DMAH) | Liquid | 60 | 225 |
|  | Trimethylaluminum | Liquid | 60–70 | 300 |
|  | Triethylaluminum | Liquid | 60–70 | 160 |
| Al, AlN | Dimethulethylamine alane (DMEAA) | Liquid | 60 | 100–180 |
| Ti, TiN | Tetrakis-diethylamino titanium (TDEAT) | Liquid | 70 | 300 |
| Ta, TaN, $Ta_2O_5$ | Tantalum pentaethoxide | Liquid | 70 | 200–300 |
| Ni | Methylcyclopentadienyl Nickel(II) | Liquid | 60–70 | 280 |
|  | Dicyclopentadienyl Nickel(II) | Liquid | 60–70 | 190–230 |
| Pt | Trimethylcyclopentadienyl Platinum | Liquid | 60–70 | 90–180 |
| Au | Dimethyltrimethylsiloxy Gold | Liquid | 60–70 | 135 |
| Cr | Chromium hexacarbonyl | Solid | 60 | 400–600 |
| Mo | Molybdenum hexacarbonyl | Solid | 50–60 | 100 |

Alternatively, a metallo-organic liquid precursor is sprayed on magnets 7 and then magnets 7 are introduced into apparatus 1 via magnet port 11. In general, the precursor form is selected so as to maximize the vapor pressure generated for the amount of heat applied.

A variety of metals may be used for coating magnets 7 including, but not limited to, nickel, gold, aluminum, platinum and palladium. The particular metal is generally selected based on the particular use of magnet 7. For example, nickel is generally used for coating magnets used in hard disk drives. In cases where it is desirable to solder to a magnet, a gold coating is used as it provides superior solderability. Platinum and palladium coatings are desirable in situations that require the best anti-corrosive coating.

In addition, the type of metal used for coating magnets 7 may be selected based on the thermal stress performance of the particular metal. For example, nickel has a thermal stress performance of 275 MPa (at 120° C.) that has been found to be satisfactory for coating magnets 7. Table 2 lists the thermal stress performance of a variety of metals that have thermal stress performance values that render them suitable for coating magnets 7.

TABLE 2

| Metal | Thermal Stress at 120° C., MPa |
|---|---|
| Nickel | 275 |
| Aluminum | 158 |
| Platinum | 151 |
| Palladium | 143 |
| Gold | 109 |

Apparatus 1 also includes an output tube 21 that is coupled to a second end of reaction chamber 3. Included in output tube 21 is a pump output 23 connected to a pump (not shown) that is used to pump out the gases from reaction chamber 3. By regulating the pumping force created by the pump, the rate at which chemical reactions occur within reaction chamber 3 may be regulated as desired. Coupled to output tube 21 is a collection tube 25 for collecting magnets 7 that have been processed in reaction chamber 3.

In operation of apparatus 1, the carrier gas 1 is input into reaction chamber 3 via carrier gas input port 15 and input tube 9. In an exemplary embodiment, nitrogen gas is input into reaction chamber 3. Next, magnets 7 are introduced into input tube 9 via body port 11. Magnets 7 are urged into reaction chamber 3 by the flow of carrier gas through input tube 9. Once inside reaction chamber 3, magnets 7 are suspended in a fluidized bed created by the carrier gas. At this point, the reactant gas is introduced into reaction chamber 3 via reactant gas port 19. Once the reactant gas is inside reaction chamber 3, a chemical reaction occurs which results in a protective coating being applied to each of magnets 7. Because magnets 7 are suspended in reaction chamber 3, the coating applied to magnets 7 is conformal and is applied to all the surfaces of each of crystalline bodies 7 simultaneously. In this way, the integrity of each of magnets 7 is retained which is especially important for magnets used in MEMS devices, such as microactuators, where an uneven coating will likely render the device unusable.

A benefit of apparatus 1 of the present invention is that magnets 7 may be uniformly coated at lower operative temperatures than the prior art processes. In particular, apparatus 1 provides for coating magnets 7 at a temperature lower than the Curie temperature, at which point the magnetic properties of magnetic materials deteriorate. For example, in an exemplary embodiment, the reactant gas used is triethylaluminum and reaction chamber 3 is heated to approximately 80°–100° C. As a result, a chemical reaction is initiated in reaction chamber 3 having the following chemical pathway:

$Al(C_2H_5)_3 \rightarrow AlH(C_2H_5)_2 + C_2H_4$.

$2\ AlH(C_2H_5)_2 \rightarrow AlH(C_2H_5)_3 + AlH_2(C_2H_5)$ $2\ AlH_2(C_2H_5)_3 \rightarrow AlH(C_2H_5)_2 + AlH_3$ $AlH_3 \rightarrow Al + \frac{1}{2}H_2$ The metal ions, in this case aluminum, are released and become attached to magnets 7 thereby forming a conformal protective coating thereon.

In another embodiment, the reactant gas is trimethylamine in which case the chemical pathway is:

$$((CH_3)_3N)AlH_3 \rightarrow Al+(CH_3)_3N+\tfrac{3}{2}H_2$$

In yet other embodiments, the reactant gas may be, by way of non-limiting example, trimethyl alane (TMAA), dimethylamine alane (DMEAA) or trimethylamine aluminaborane (TMAAB).

Once magnets 7 are conformally coated in reaction chamber 3, the source of reactant gas is turned off and carrier gas input valve 17 is adjusted to increase the amount of carrier gas entering into reaction chamber 3. This increase in carrier gas causes magnets 7 to be expelled from reaction chamber 3 and be deposited in collection tube 25.

Figure 2:
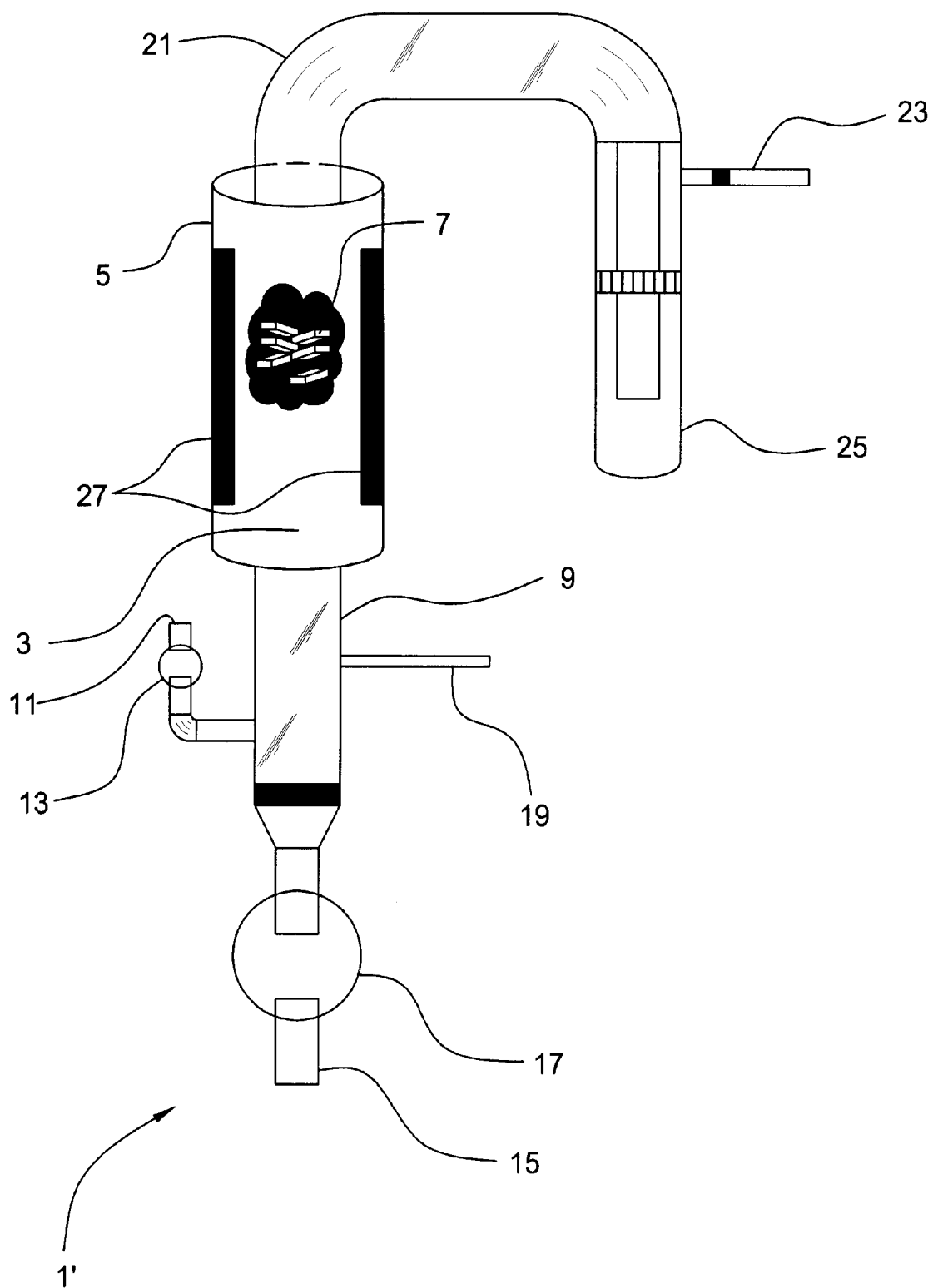
FIG. 2 is a schematic of an apparatus for conformally coating magnets according to a second embodiment.
Figure 3:
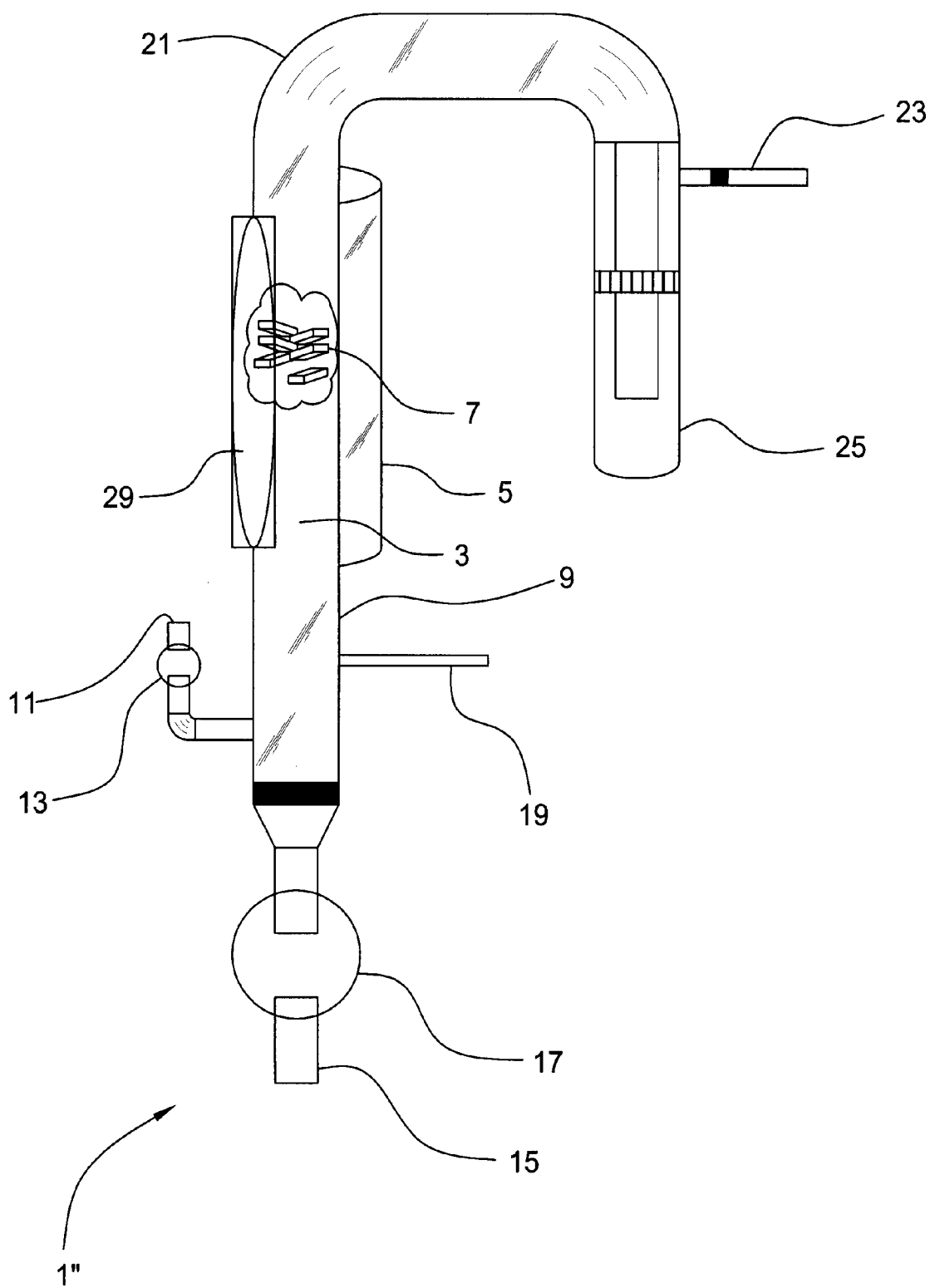
FIG. 3 is a schematic of an apparatus for conformally coating magnets according to a third embodiment.

Referring now to FIG. 2, there is shown an apparatus 1' of a second embodiment of the present invention. Elements that are identical to that of FIG. 1 are similarly labeled and a detailed description thereof will be eliminated.

Apparatus 1' includes a pair of RF electrodes 27 that are positioned adjacent to reaction chamber 3. RF electrodes 27 create an oscillating field of electrons and ions, i.e. plasma, in reaction chamber 3 that increases the rate of chemical reaction that occurs in reaction chamber 3. There are several benefits of using a plasma initiated chemical reaction in apparatus 1'. First, lower temperatures may be used in reaction chamber 3 thereby increasing the range of materials that may be used to coat magnets 7. Second, the deposition rate on magnets 7 is increased for reactions taking place at a particular temperature. In addition, while thermally initiated reactions only support thermal cracking and recombination, plasma initiated chemical reactions support a wider variety of reactions including ionic and electron neutral reactions. As a result, different material qualities, such as wear resistance and temperature tolerance, may be improved by using a plasma initiated chemical reaction.

In an exemplary embodiment, the reactant gas input into reaction chamber 3 of apparatus 1' is hexamethylaluminum in which a chemical reaction having the following chemical pathways occurs within reaction chamber 3:

$$Al_2(CH_3)_6 \rightarrow Al(CH_3)_2 + Al(CH_3) + C_2H_6 + CH_4$$

$$Al(CH_3)_2 + \tfrac{1}{2}H2 \rightarrow Al + 2CH_4$$

$$Al(CH_3) + \tfrac{1}{2}H2 \rightarrow Al + CH_4$$

In this embodiment, at a process temperature of 100° C., a 300 angstrom/minute deposition rate can be achieved.

Referring now to FIG. 5, there is shown an apparatus 1" of a third embodiment of the present invention. Elements that are identical to that of FIG. 1 are similarly labeled and a detailed description thereof will be eliminated.

Apparatus 1" includes UV light source 29 adjacent reaction chamber 3. By introducing UV light into reaction chamber 3, the chemical reaction is optically activated. In this way, a particular photo-chemical route is specified and secondary chemical reactions are eliminated. As a result, coatings produced by apparatus 1" are of higher quality than coatings produced by apparatus 1 and 1'.

In an exemplary embodiment, the reactant gas input into reaction chamber 3 of apparatus 1" is trimethylaluminum in which a chemical reaction having the following chemical pathways occurs within reaction chamber 3:

$$Al(CH_3)_3 + h\nu \longrightarrow Al(CH_3)_2 + CH_3$$

-continued
$$Al(CH_3)_2 \longrightarrow Al + C_2H_6.$$

$h\nu = 230\text{–}255$ nm

Accordingly, an apparatus and method is provided for conformally coating small magnets, and, in particular, small magnets used in MEMS devices such as microactuators, by introducing a metallo-organic reactant gas into a chemical vapor deposition apparatus. By using a metallo-organic reactant gas, the coating can be applied at significantly lower temperatures than used in prior art processes so that the magnetic properties of the magnetic material does not degrade.

It will thus be seen that the objects set forth above, among those made apparent from the preceding description, are efficiently attained and, since certain changes may be made in carrying out the above process, in a described product, and in the construction set forth without departing from the spirit and scope of the invention, it is intended that all matter contained in the above description shown in the accompanying drawing shall be interpreted as illustrative and not in a limiting sense.

It is also to be understood that the following claims are intended to cover all of the generic and specific features of the invention herein described, and all statements of the scope of the invention, which, as a matter of language, might be said to fall therebetween.

What is claimed is:

1. An apparatus for uniformly coating a magnet having a plurality of surfaces, comprising:
    a reaction chamber having a port for introducing said magnet into said reaction chamber;
    a heater for heating said reaction chamber;
    a carrier gas port being in fluid communications with said reaction chamber for introducing a carrier gas into said reaction chamber;
    a reactant gas port being in fluid communications with said reaction chamber for introducing a reactant gas into said reaction chamber; and
    a UV light source adjacent said reaction chamber;
    wherein when said magnet and said carrier gas are introduced into said reaction chamber, said magnet becomes suspended in said reaction chamber so that when said reactant gas is introduced in said reaction chamber, said UV light source causes an optically activated chemical reaction to occur and causes all of said plurality of surfaces of said magnet to be uniformly coated.

2. The apparatus of claim 1, wherein said magnet is associated with a micro-electromechanical system.

3. The apparatus of claim 1, further comprising an RF source adjacent said reaction chamber so that when said reactant gas is introduced into said reaction chamber, said RF source causes a plasma initiated chemical reaction to occur.

4. The apparatus of claim 1, wherein said carrier gas is nitrogen.

5. The apparatus of claim 1, wherein said carrier gas is inert and non-reactive.

6. The apparatus of claim 1, wherein said reactant gas is metallo-organic.

7. The apparatus of claim 6, wherein said reactant gas is selected from a group including triethylaluminum, trimethylamine alane, trimethyl alane, dimethylamine alane, trimethylamine aluminaborane and silicon dioxide.

8. The apparatus of claim 2, further comprising an adjustable pump in fluid communications with said reaction chamber, said pump creating a negative pressure in said reaction chamber for varying the rate of said chemical reaction.

9. The apparatus of claim 1, wherein additional carrier gas is introduced into said reaction chamber for expelling said crystalline body from said reaction chamber.

10. The apparatus of claim 1, wherein said heater is adjusted so that said temperature in said reaction chamber is in the range of 80° to 100° C.

11. A system for uniformly coating a magnet having a plurality of surfaces and at least one defect, comprising:
- a means for introducing said magnet into a reaction chamber;
- a means for heating said reaction chamber;
- a means for introducing a carrier gas into said reaction chamber so that said magnet becomes suspended in said reaction chamber; and
- a means for introducing a reactant gas into said reaction chamber; and
- a means for introducing UV radiation into said reaction chamber to cause an optically activated chemical reaction to occur so that all of said plurality of surfaces of said magnet become uniformly coated.

12. Coating apparatus, comprising:
- a vertically aligned hollow tube having two ends;
- a source of carrier gas communicating with said tube adjacent a lower end of the tube;
- a part supply port communicating with said hollow tube vertically above the source of carrier gas;
- a reaction gas port communicating with said hollow tube above the source of carrier gas; and
- a part output tube communicating with the hollow tube adjacent the top of the hollow tube;

wherein the hollow tube includes a portion that is transparent to light; and the coating apparatus further comprises a source of UV light located adjacent the transparent portion.

* * * * *

UNITED STATES PATENT AND TRADEMARK OFFICE
CERTIFICATE OF CORRECTION

PATENT NO.    : 6,540,839 B1
DATED         : April 1, 2003
INVENTOR(S)   : Walter Lee et al.

It is certified that error appears in the above-identified patent and that said Letters Patent is hereby corrected as shown below:

Column 2,
Line 40, please change "filler" to -- fuller --.

Column 6,
Line 66, please change "claim 2" to -- claim 1 --.

Signed and Sealed this

Twelfth Day of August, 2003

JAMES E. ROGAN
*Director of the United States Patent and Trademark Office*